United States Patent
Wu et al.

(10) Patent No.: US 6,927,345 B2
(45) Date of Patent: Aug. 9, 2005

(54) GUARD RING HAVING ELECTRICALLY ISOLATED LIGHTENING BARS

(75) Inventors: Tien-Chi Wu, Yunghe (TW);
Kou-Chou Chen, Tainan (TW);
Huai-Jen Hsu, Hsinchu (TW); George Huang, Miaoli (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 290 days.

(21) Appl. No.: 10/150,321

(22) Filed: May 16, 2002

(65) Prior Publication Data

US 2003/0213612 A1 Nov. 20, 2003

(51) Int. Cl.[7] .................................................. H05K 1/03
(52) U.S. Cl. ............................ 174/255; 174/261; 430/5
(58) Field of Search ................................ 174/250, 255, 174/260, 261; 361/816–818; 430/5

(56) References Cited

U.S. PATENT DOCUMENTS

| | | | | |
|---|---|---|---|---|
| 5,272,371 A | * | 12/1993 | Bishop et al. .............. | 257/362 |
| 5,714,784 A | * | 2/1998 | Ker et al. .................... | 257/360 |
| 6,060,752 A | * | 5/2000 | Williams ..................... | 257/355 |
| 6,153,913 A | * | 11/2000 | Hsu et al. .................... | 257/355 |
| 6,291,114 B1 | * | 9/2001 | Reijers ......................... | 430/5 |
| 6,372,390 B1 | * | 4/2002 | Liu et al. ...................... | 430/5 |
| 6,509,617 B2 | * | 1/2003 | Hiraga ......................... | 257/409 |

* cited by examiner

*Primary Examiner*—Kamand Cuneo
*Assistant Examiner*—Jeremy Norris
(74) *Attorney, Agent, or Firm*—Tung & Associates

(57) ABSTRACT

A guard ring for protecting against electrostatic discharge (ESD) that has electrically isolated lightning bars has a substrate, a first ring, and a second ring. The first ring is on the substrate and has a number of electrically connected lightning bars. The second ring is also on the substrate and concentric to the first ring, but has a number of lightning bars that are electrically isolated from one another. The first ring may be the outer ring and the second ring may be the inner ring, or vice-versa. The guard ring has an ESD breakdown voltage that does not change, even after the first ring or the second ring has protected against ESD. The guard ring may protect a semiconductor component like a semiconductor photomask or a semiconductor device.

16 Claims, 3 Drawing Sheets

GUARD RING HAVING ELECTRICALLY ISOLATED LIGHTENING BARS

FIELD OF THE INVENTION

This invention relates generally to electrostatic discharge (ESD) within semiconductor circuits and photomasks, and more particularly to guard rings for such ESD.

BACKGROUND OF THE INVENTION

The invention of the transistor and the integrated circuit has led to the development of improved methods for handling electronic devices. The semiconductor design and manufacturing process often results in specific devices having varying degrees of susceptibility to electrostatic discharge (ESD). When two objects with difference charges are brought together, the charges move between the objects until both have the same charge. The objects are thus discharged. The small amount of energy produced by an ESD can destroy the intricate pathways and gates inside an integrated circuit. ESD can be thought of in layman's terms as a static spark.

Despite a great deal of effort, ESD still affects production yields, manufacturing costs, product quality, product reliability, and profitability. The cost of damaged devices themselves ranges from only a few cents for a simple diode to several hundred dollars for complex hybrids. When associated costs of repair and rework, shipping, labor, and overhead are included, the costs may be much higher.

Static electricity is generally defined as an electrical charge caused by an imbalance of electrons on the surface of a material. This imbalance of electrons produces an electric field that can be measured and that can influence other objects at a distance. ESD is generally defined as the transfer of charge between bodies at different electrical potentials.

Electrostatic discharge can change the electrical characteristics of a semiconductor device, degrading or destroying it. Electrostatic discharge also may upset the normal operation of an electronic system, causing equipment malfunction or failure. Another problem caused by static electricity occurs in clean rooms. Charged surfaces can attract and hold contaminants, making removal from the environment difficult. When attracted to the surface of a silicon wafer or a device's electrical circuitry, these particulates can cause random wafer defects and reduce product yields.

ESD can be protected against by at least two approaches. First, environmental considerations can be taken into account to reduce the potential for ESD as much as possible. Second, a semiconductor device can intrinsically have some ESD protection. Usually, a combination of at least these two approaches is used, such as by designing a certain level of ESD resistance in a semiconductor device, and instructing users to take basic ESD precautions.

An example of designing ESD protection into a semiconductor device is the guard ring, or guard track. A guard ring does not carry a return current for a semiconductor circuit under normal operation, and is tracked around the entire perimeter of the semiconductor device, or around individual circuits or components of the device. The purpose of the guard ring is to act as a return source for current that is radiating out of or incident to the semiconductor device.

Guard rings are also used in the context of semiconductor photolithographic masks employed during semiconductor device fabrication. A mask, or a photomask, is a device that allows selective exposure of photoresist on a semiconductor wafer by blocking exposure in certain areas. A mask includes two parts, an opaque, or non-transparent, part, and a blank, or transparent, part. Generally, the blank part of the mask is the actual substrate of the mask, such as high-quality quartz or glass. The opaque part is then formed on the blank part, and may be made of chrome. Guard rings are thus placed on photomasks to protect the important circuit patterns of the masks from being damaged by ESD. Guard rings in such instances may track around the perimeter of the entire mask, or only around crucial circuits on the mask.

FIG. 1 shows an example of a photomask 100 that has a guard ring 101 formed on it. The substrate of the mask 100 is transparent, and can be quartz or glass. The guard ring 101 is opaque, and can be chrome. The guard ring 101 has an outer ring 102 and an inner ring 104. The rings 102 and 104 may initially have a breakdown voltage against which they protect. That is, the rings 102 and 104 protect against ESD by being rated for a certain breakdown voltage. This rating ensures that, initially, the rings 102 and 104 can accommodate an ESD of their associated rated voltage, and thus protect the circuits that the rings 102 and 104 circumscribe (not particularly shown in FIG. 1).

A particular area 107 of the guard ring 101 is shown in more detail in FIG. 2. Each of the outer ring 102 and the inner ring 104 has a number of lightening bars. For example, one of the lightening bars of the outer ring 102 is indicated as the lightening bar 106, whereas one of the lightening bars of the inner ring 104 is indicated as the lightening bar 108. As shown in FIG. 2, each of the rings 102 and 104 is a solid ring, such that the lightening bars of the ring 102 are electrically connected to one another, and the lightening bars of the ring 104 are electrically connected to one another.

As shown in FIG. 2, the inner ring 104 has protected against the breakdown voltage, as evidenced by one of its lightening bars, the lightening bar 110, having shorted with the outer ring 102. Whereas this ESD protection has protected the semiconductor circuits imprinted on the mask 100 of FIG. 1, the guard ring 101 is seriously impaired for future ESD protection. In particular, the shorting of the lightening bar 110 causes the outer ring 102 to now be electrically connected to the inner ring 104. This means that the there may be no ESD protection afforded by the outer ring 102 and the inner ring 104. Thus, the internal circuitry imprinted on the mask 100 may no longer be protected.

Therefore, there is a need a guard ring that overcomes these disadvantages. Specifically, there is a need for a guard ring that still allows for ESD breakdown voltage protection, even after one of the outer and inner rings of the guard ring has already protected against ESD. For these and other reasons, there is a need for the present invention.

SUMMARY OF THE INVENTION

The invention relates to a guard ring for protecting against electrostatic discharge (ESD) that has electrically isolated lightening bars. The guard ring has a substrate, a first ring, and a second ring. The first ring is on the substrate and has a number of electrically connected lightening bars. The second ring is also on the substrate and concentric to the first ring, but has a number of lightening bars that are electrically isolated from one another. The first ring may be the outer ring and the second ring may be the inner ring, or vice-versa. The guard ring has an ESD breakdown voltage, against which it protects.

Embodiments of the invention provide for advantages over the prior art. Even after the first ring or the second ring has protected against ESD, such that shorting of one of its lightening bars may have occurred, the ESD breakdown voltage remains the same. This ensures that the semiconductor component, such as a semiconductor photomask or a semiconductor device, being protected by the guard ring remains optimally protected from ESD. That is, even after one of the lightening bars has shorted, the breakdown voltage remains the same. Thus, the ESD protection capability of the guard ring remains the same as it was initially designed. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
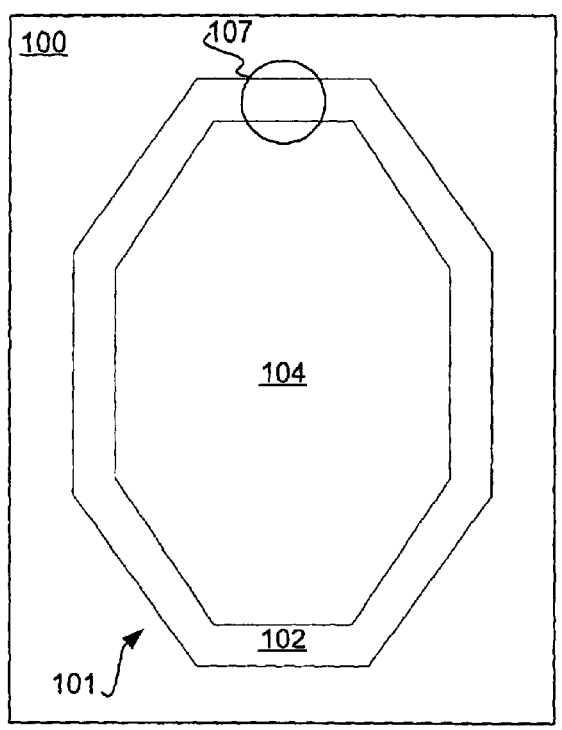
FIG. 1 is a diagram of a guard ring having two rings for protecting a semiconductor component, such as a semiconductor device, a photomask, or another component, against electrostatic discharge (ESD).
Figure 2:
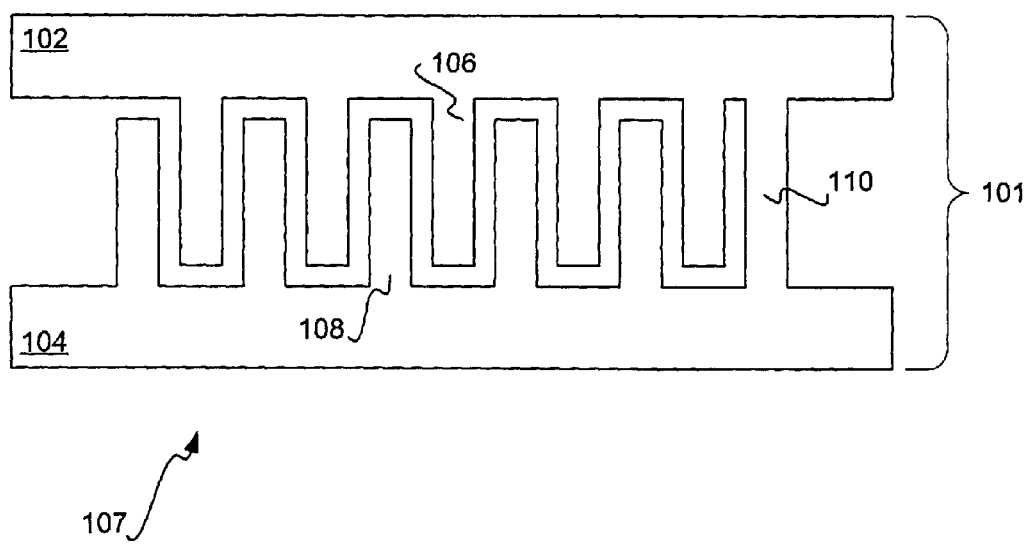
FIG. 2 is a diagram of the guard ring of FIG. 1 in more detail, according to the prior art, where a lightening bar of the inner ring has shorted with the outer ring as a result of ESD. After such initial ESD protection, the guard ring of FIG. 2 subsequently provides for lesser ESD protection, because the lightening bars of the inner ring are electrically connected to one another, and the lightening bars of the outer ring are electrically connected to one another.
Figure 3:
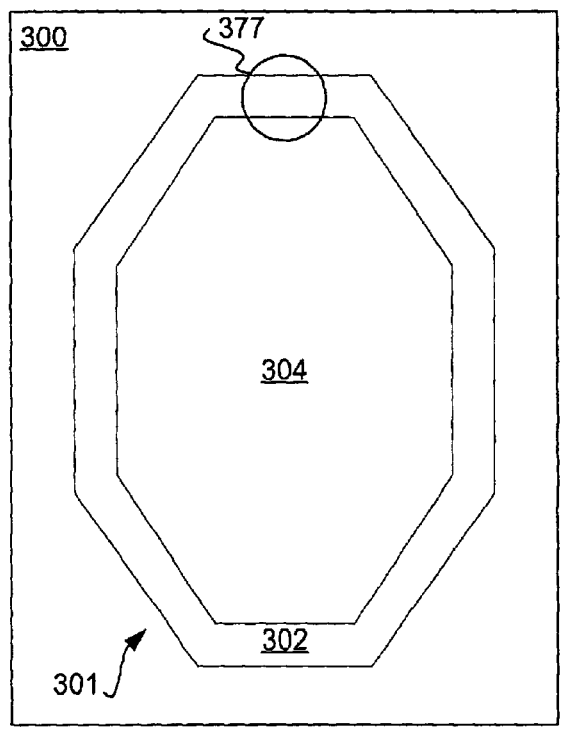
FIG. 3 is a diagram of a guard ring having two rings for protecting a semiconductor component, such as a semiconductor device, a photomask, or another component, against ESD, according to an embodiment of the invention.

FIG. 3 shows an example of a guard ring 301 on a substrate 300 of a semiconductor component, according to an embodiment of the invention. The semiconductor component may be a semiconductor device, a photomask for use in photolithography, or another type of semiconductor component. In the case of a photomask, the substrate 300 is at least substantially transparent, and may be quartz or glass. The guard ring 301, by comparison, in the case of a photomask is at least substantially opaque, and may be chrome. The guard ring 301 may surround a circuit area of the semiconductor component, which is not specifically called out in FIG. 3.

The guard ring 301 has an outer ring 302 and an inner ring 304. The guard ring 301 has an electrostatic discharge (ESD) breakdown voltage against which it protects, and that remains even after one or more of the rings 302 and 304 has protected against a specific instance of ESD occurring. The guard ring 301 thus protects against ESD by being rated for a certain breakdown voltage. This rating ensures that the ring 301 can accommodate an ESD of its associated rated voltage, and protect the circuits that the rings 302 and 304 circumscribe (not particularly shown in FIG. 3). The rings 302 and 304 are preferably concentric to each other.

Figure 4:
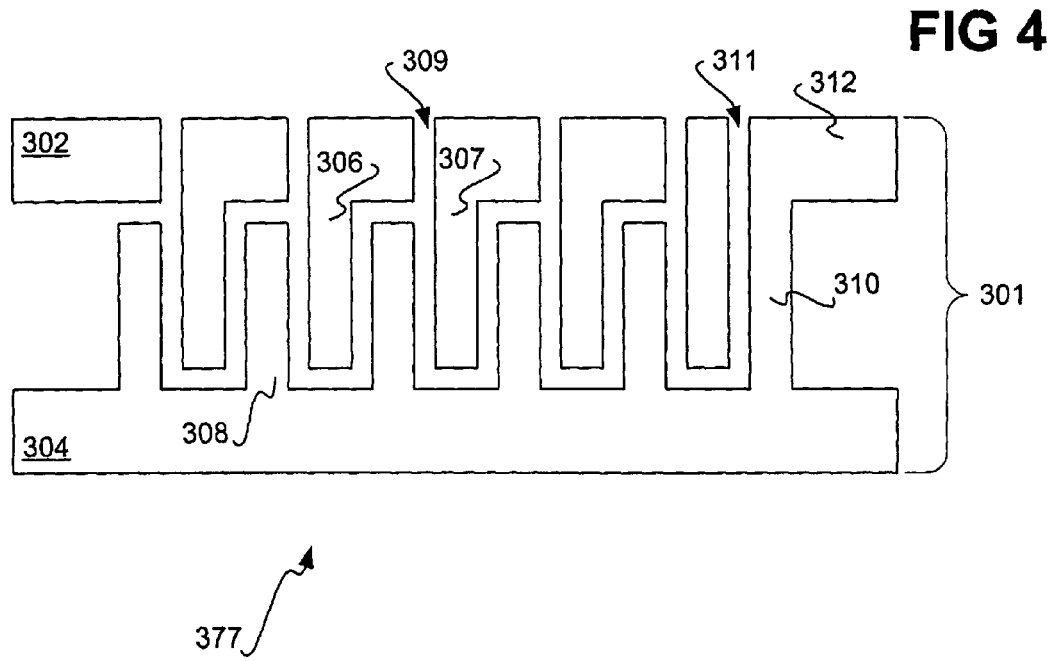
FIG. 4 is a diagram of guard ring of FIG. 3 in more detail, according to an embodiment of the invention, where a lightening bar of the inner ring has shorted with the outer ring as a result of ESD. After such initial ESD protection, the guard ring of FIG. 4 subsequently provides for the same level of ESD protection, in contradistinction to the prior art, because the lightening bars of the outer ring are electrically isolated from one another.

A particular area 377 of the guard ring 301 is shown in more detail in FIG. 4. Each of the outer ring 302 and the inner ring 304 has a number of lightening bars. For example, two of the lightening bars of the outer ring 302 are indicated as the lightening bars 306 and 307, whereas one of the lightening bars of the inner ring 304 is indicated as the lightening bar 308. As shown in FIG. 4, the inner ring 304 is a solid ring, such that the lightening bars of the ring 304 are electrically connected to one another. However, the outer ring 302 has gaps therein, such as the gap 309 between the lightening bars 306 and 307 thereof. Each lightening bar of the outer ring 302 is thus electrically isolated from the other lightening bars of the outer ring 302.

As shown in FIG. 4, the inner ring 304 has protected against its breakdown voltage, as evidenced by one of its lightening bars, the lightening bar 310, having shorted with the outer ring 302. Even though this ESD protection has protected the semiconductor circuits, the guard ring 301 still protects against future ESD. This is because the shorting of the lightening bar 310 has only affected a portion 312 of the outer ring 302, and thus only one lightening bar of the outer ring 302. The other portions of the outer ring 302, such as those including the lightening bars 306 and 307, remain electrically disconnected from the lightening bar 310. Therefore, the breakdown voltage of the guard ring 301 remains the same even after this shorting.

Figure 5:
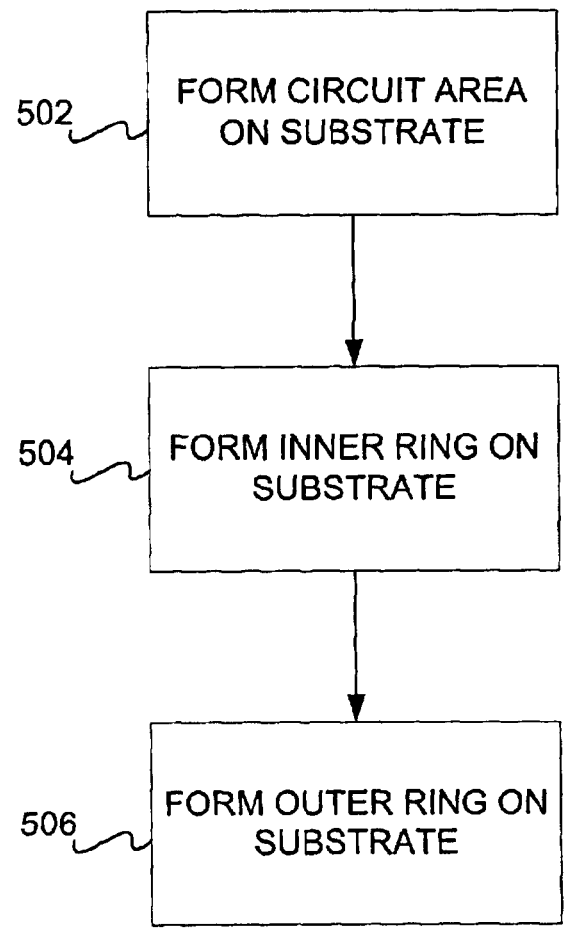
FIG. 5 is a flowchart providing an overview for fabricating a semiconductor component having a guard ring that provides for the same level of ESD protection even after initial ESD protection, according to an embodiment of the invention. The semiconductor component may be a semiconductor device, a photomask, or another type of semiconductor component.
Figure 5:
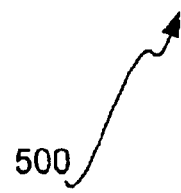

FIG. 5 shows a method 500 that summarizes the fabrication of a semiconductor component, such as a semiconductor device or photomask, according to an embodiment of the invention. Those of ordinary skill within the art will appreciate that the actual fabrication of such a semiconductor component may employ other steps and/or acts besides those described herein, and the steps and/or acts of the method 500 described herein can be performed in varying ways. First, a circuit area is formed on a substrate of the component (502).

Next, an inner ring is formed on the substrate that surrounds the circuit area (504). Finally, an outer ring is formed on the substrate that is concentric to the inner ring (506). The ESD breakdown voltage of the guard ring made up of the inner and outer rings does not change, even after the inner ring or the outer ring has protected against ESD, as has been described. For instance, this may be because the inner ring has lightening bars that are isolated from one another. Alternatively, this may be because the outer ring has lightening bars that are isolated from one another.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas the invention has been substantially described as having an outer ring that has lightening bars electrically isolated from one another, the inner ring instead of the outer ring may have such electrically isolated lightening bars. Therefore, it is manifestly intended that this invention be limited only by the claims and equivalents thereof.

What is claimed is:

1. A guard ring for electrostatic discharge (ESD) protection comprising:
   a substrate;
   a first ring on the substrate having a plurality of electrically connected lightning bars, each bar being substantially rectangular in shape, the electrically connected lightning bars defining a plurality of gaps, each gap between two immediately adjacent electrically connected lightning bars; and,
   a second ring on the substrate, concentric to the first ring, and having a plurality of lightning bars electrically isolated from one another, all of the lightning bars of the second ring each at least substantially situated within one of the gaps defined by the electrically connected lightning bars of the first ring.

2. The guard ring of claim 1, wherein the guard ring has an ESD breakdown voltage that, even after one of the first ring and the second ring has protected against ESD, remains the same.

3. The guard ring of claim 1, wherein the first ring is an outer ring, and the second ring is an inner ring.

4. The guard ring of claim 1, wherein the first ring is an inner ring, and the second ring is an outer ring.

5. The guard ring of claim 1, wherein the plurality of lightning bars of the second ring are completely electrically isolated from one another.

6. The guard ring of claim 1, wherein the substrate is at least substantially transparent, and each of the first ring and the second ring is at least substantially opaque.

7. The guard ring of claim 1, wherein the substrate is one of glass and quartz.

8. The guard ring of claim 1, wherein each of the first ring and the second ring is chrome.

9. The guard ring of claim 1, wherein the substrate is a substrate of a photomask, such that the guard ring provides for ESD protection of the photomask.

10. A photomask comprising:
    a substantially transparent substrate;
    a circuit area formed on the substantially transparent substrate that is substantially opaque;
    an inner ring on the substrate that is substantially opaque and that surrounds the circuit area, the inner ring providing electrostatic discharge (ESD) protection of the circuit area;
    an outer ring on the substrate concentric to the inner ring that is substantially opaque, the outer ring also providing ESD protection of the circuit area;
    a plurality of electrically connected lightning bars that are part of one of the inner ring and the outer ring, the electrically connected lightning bars defining a plurality of gaps, each gap between two immediately adjacent electrically connected lightning bars; and,
    a plurality of lightning bars that are electrically isolated from one another and that are part of another of the inner ring and the outer ring, all of the lightning bars that are electrically isolated from one another each at least substantially situated within one of the gaps defined by the electrically connected lightning bars.

11. The photomask of claim 10, wherein the guard ring has an ESD breakdown voltage that, even after one of the inner ring and the outer ring has protected against ESD, remains the same.

12. The photomask of claim 10, wherein the plurality of electrically connected lightning bars are part of the inner ring, and the plurality of lightning bars that are electrically isolated from one another are part of the outer ring.

13. The photomask of claim 10, wherein the plurality of electrically connected lightning bars are part of the outer ring, and the plurality of lightning bars that are electrically isolated from one another are part of the inner ring.

14. The photomask of claim 10, wherein the plurality of lightning bars that are electrically isolated from one another are completely electrically isolated from one another.

15. The photomask of claim 10, wherein the substrate is one of glass and quartz.

16. The photomask of claim 10, wherein the circuit area, the inner ring, and the outer ring are chrome.

* * * * *